United States Patent
D'Abreu

(10) Patent No.: US 9,244,767 B1
(45) Date of Patent: Jan. 26, 2016

(54) DATA STORAGE DEVICE WITH IN-MEMORY PARITY CIRCUITRY

(71) Applicant: SANDISK TECHNOLOGIES INC., Plano, TX (US)

(72) Inventor: Manuel Antonio D'Abreu, El Dorado Hills, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/325,023

(22) Filed: Jul. 7, 2014

(51) Int. Cl.
*G06F 11/10* (2006.01)
*G11C 29/52* (2006.01)

(52) U.S. Cl.
CPC ............ *G06F 11/1072* (2013.01); *G11C 29/52* (2013.01)

(58) Field of Classification Search
CPC ............................ G06F 11/1072; G11C 29/52
USPC .................... 714/747, E11.053, 758
See application file for complete search history.

(56) References Cited

U.S. PATENT DOCUMENTS

| | | | | |
|---|---|---|---|---|
| 2008/0250300 | A1* | 10/2008 | Mokhlesi et al. ............. | 714/780 |
| 2010/0017649 | A1 | 1/2010 | Wu et al. | |
| 2010/0332729 | A1* | 12/2010 | Alrod et al. ................... | 711/103 |
| 2014/0075259 | A1* | 3/2014 | Tam .............................. | 714/747 |

OTHER PUBLICATIONS

"Raid," Wikipedia, the Free Encyclopedia, http://en.wikipedia.org/w/index.php?title=RAID&printable=yes, printed Jun. 5, 2014, 12 pages.

* cited by examiner

*Primary Examiner* — Albert Decady
*Assistant Examiner* — Kyle Vallecillo
(74) *Attorney, Agent, or Firm* — Toler Law Group, PC

(57) ABSTRACT

A data storage device includes a memory die. The memory die includes parity circuitry and a memory having a three-dimensional (3D) memory configuration. The memory includes a first block, a second block, and a third block. A method includes generating parity information based on first data associated with a first word line of the first block and further based on second data associated with a second word line of the second block. The parity information is generated by the parity circuitry. The method further includes writing the parity information to a third word line of the third block.

20 Claims, 7 Drawing Sheets

300 ↴

302

At a data storage device that includes a memory die, where the memory die includes parity circuitry and a memory having a 3D memory configuration, and where the memory includes a first block, a second block, and a third block, generate parity information based on first data associated with a first word line of the first block and further based on second data associated with a second word line of the second block, where the parity information is generated by the parity circuitry

304

Write the parity information to a third word line of the third block

DATA STORAGE DEVICE WITH IN-MEMORY PARITY CIRCUITRY

FIELD OF THE DISCLOSURE

The present disclosure is generally related to data storage devices and more particularly to parity circuitry for a data storage device.

BACKGROUND

Non-volatile data storage devices have enabled increased portability of data and software applications. For example, multi-level cell (MLC) storage elements of a flash memory device may each store multiple bits of data, enhancing data storage density as compared to single-level cell (SLC) flash memory devices. As another example, a memory with a three-dimensional (3D) memory configuration may include multiple layers of storage elements, thus increasing data storage density compared to a two-dimensional (2D) (or "planar") memory device. Consequently, memory devices enable users to store and access a large amount of data.

As data storage density increases, error rates of stored data may also increase (e.g., due to noise and other factors). A data storage device may encode and decode data using an error correcting code (ECC) technique. The ECC technique may enable error correction. In some cases, data stored at the data storage device may include a large number of errors (e.g., due to noise or other factors). In this case, an error rate of data may exceed an error correction capability associated with the particular ECC scheme used by the data storage device, which may result in data loss.

Some data storage devices generate parity information using multiple pages of data, such as by performing an exclusive-OR (XOR) operation between the multiple pages of data. In this case, if one of the multiple pages cannot be decoded due to a large number of errors, the other pages and the parity information may be XORed to recover the page. Such a technique may involve multiple sense operations as well as XOR computations, which may increase latency at the data storage device.

SUMMARY

A data storage device includes a memory die, and the memory die may include a memory (e.g., multiple blocks of word lines) and parity circuitry to enable in-memory parity operations at the memory die. The parity operations may include generating parity information based on data associated with word lines of the memory and/or recovering data of one of the word lines using the parity information and data of the other word lines. Integrating the parity circuitry in the memory die may reduce a number of communications sent between the memory die and a controller of the data storage device. For example, instead of sending parity information and multiple pages of data to the controller to enable recovery of a single page, the page can be recovered at the memory die using the parity circuitry. In an illustrative implementation, the controller and the memory die are coupled via a bus, and traffic at the bus is reduced by performing in-memory parity operations using the parity circuitry of the memory die.

In certain implementations, the memory die may further include selection circuitry that can select multiple word lines in parallel. To illustrate, a word line of a block of the memory may be associated with a particular index value that identifies a number of word lines between the word line and a substrate of the memory die (e.g., 0, 1, 2, ... k, where k is a positive integer). In this case, multiple blocks may be included in a parity group. The selection circuitry may select each word line of the multiple blocks having the particular index value (e.g., 0, 1, 2, or k) in parallel and may cause data from each of the word lines to be provided to the parity circuitry for a parity operation. By selecting multiple word lines associated with the same index value, the selection circuitry can access the multiple word lines in response to a single indication received from the controller (e.g., an indication of the index value). In an illustrative implementation, the controller and the memory die are coupled via a bus, and traffic at the bus is reduced by enabling the selection circuitry to access multiple word lines based on a single indication received from the controller.

BRIEF DESCRIPTION OF THE DRAWINGS

FIG. 3 is a flow diagram of an illustrative method of operation of the data storage device of FIG. 1;

DETAILED DESCRIPTION

Figure 1:
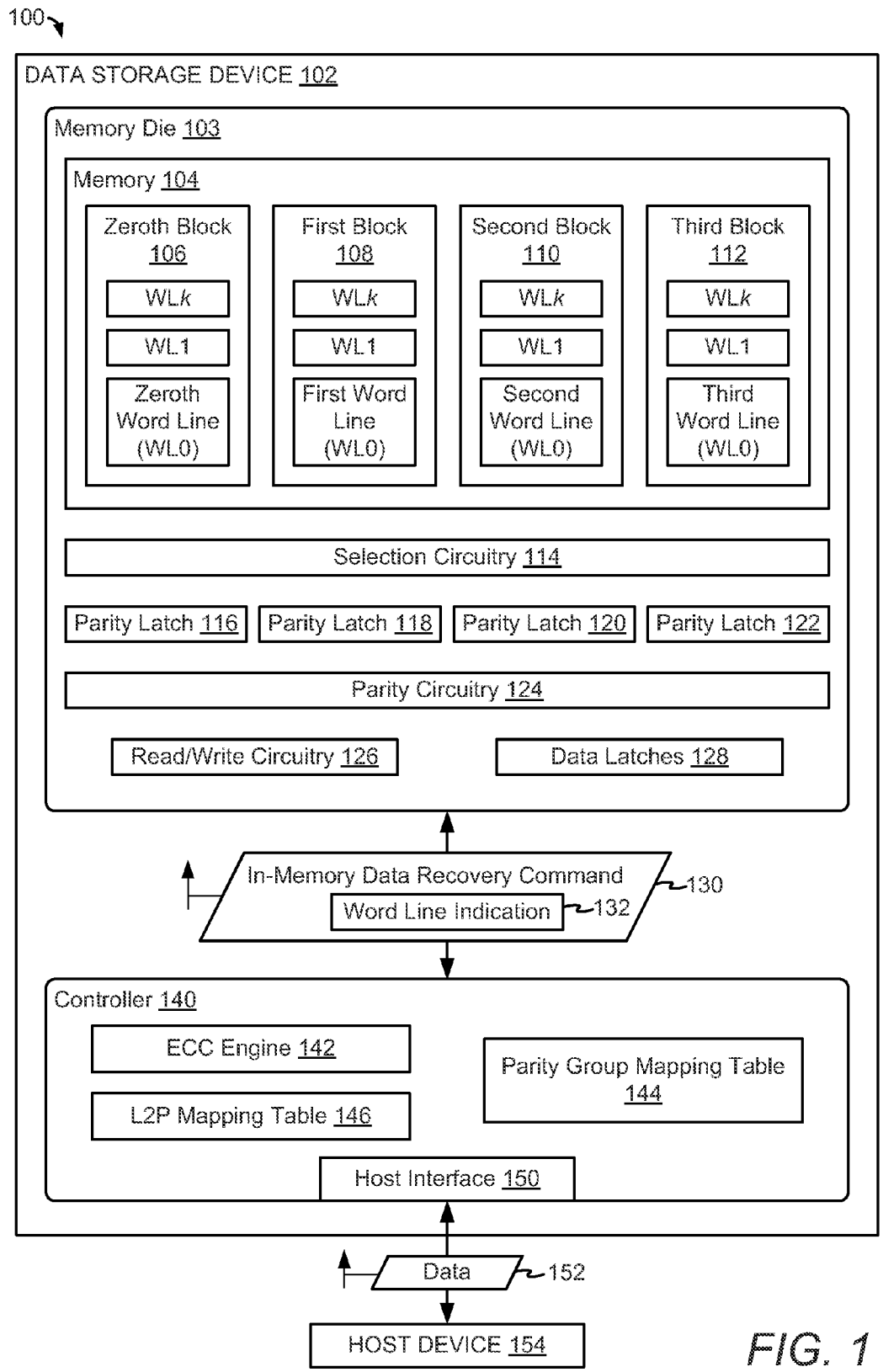
FIG. 1 is a block diagram of a particular illustrative embodiment of a system that includes a data storage device having a memory die that includes a memory configured to perform in-memory parity operations.

Referring to FIG. 1, an illustrative example of a system is depicted and generally designated 100. The system 100 includes a data storage device 102 and a host device 154. The data storage device 102 and the host device 154 may be operationally coupled via a connection, such as a bus or a wireless connection. The data storage device 102 may be embedded within the host device 154, such as in accordance with a Joint Electron Devices Engineering Council (JEDEC) Solid State Technology Association Universal Flash Storage (UFS) configuration. Alternatively, the data storage device 102 may be removable from the host device 154 (i.e., "removably" coupled to the host device 154). As an example, the data storage device 102 may be removably coupled to the host device 154 in accordance with a removable universal serial bus (USB) configuration. In an illustrative implementation, the data storage device 102 corresponds to a solid-state drive (SSD) that can be integrated within an electronic device, such as the host device 154.

The data storage device 102 includes a memory die 103 (e.g., an integrated circuit) and a controller 140. The memory die 103 and the controller 140 may be coupled via one or more buses or other structures.

The memory die 103 includes a memory 104 (e.g., a memory array), selection circuitry 114 and parity latches 116, 118, 120, and 122. The memory die 103 may further include parity circuitry 124, read/write circuitry 126, and data latches 128. In a particular embodiment, the memory die 103 includes a corresponding parity latch for each block of the memory 104 (e.g., n parity latches corresponding to n blocks of the memory 104) (where n is a positive integer). Although FIG. 1 illustrates that the memory die 103 includes four parity latches, it should be appreciated that the memory die 103 may include a different number of parity latches (i.e., fewer than four parity latches or more than four parity latches).

The memory 104 may include a non-volatile memory, such as a NAND flash memory or a resistive random access memory (ReRAM). The memory 104 may have a three-dimensional (3D) memory configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a stacked 2D memory configuration.

The memory 104 may correspond to a non-volatile memory that includes multiple blocks (e.g., erase groups of storage elements of the memory 104). To illustrate, FIG. 1 depicts that the memory 104 may include a block 0 (e.g., a zeroth block, such as a block 106), a block 1 (e.g., a first block, such as a block 108), a block 2 (e.g., a second block, such as a block 110), and a block 3 (e.g., a third block, such as a block 112). Each of the blocks 106, 108, 110, and 112 may include multiple word lines. For example, in FIG. 1, each of the blocks 106, 108, 110, and 112 includes (k−1) word lines (k is an integer that is greater than two) (i.e., each of the blocks 106, 108, 110, and 112 includes a corresponding set of word lines WL0, WL1, . . . WLk). It should be appreciated that the example of FIG. 1 is illustrative and that the memory 104 may include a different number of blocks and/or word lines than depicted in FIG. 1.

The controller 140 may include an error correcting code (ECC) engine 142. The controller 140 may be configured to store a parity group mapping table 144 and a logical-to-physical (L2P) mapping table 146. FIG. 1 further illustrates that the controller 140 may include a host interface 150.

The ECC engine 142 is configured to receive data and to generate one or more ECC codewords based on the data. The ECC engine 142 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof.

The ECC engine 142 is configured to decode data accessed from the memory 104. For example, the ECC engine 142 may be configured to decode data accessed from the memory 104 to detect and correct one or more errors that may be present in the data, up to an error correcting capacity of the particular ECC scheme. The ECC engine 142 may include a Hamming decoder, an RS decoder, a BCH decoder, an LDPC decoder, a turbo decoder, a decoder configured to decode data according to one or more other ECC schemes, or a combination thereof.

The controller 140 is configured to receive data and instructions from the host device 154 and to send data to the host device 154. For example, the controller 140 may send data to the host device 154 via the host interface 150 and may receive data from the host device 154 via the host interface 150.

The controller 140 is configured to send data and commands to the memory 104 and to receive data from the memory 104. For example, the controller 140 is configured to send data and a write command to cause the memory 104 to store the data to a specified address of the memory 104. The write command may specify a physical address of a portion of the memory 104 (e.g., a physical address of a word line of the memory 104) that is to store the data. The controller 140 is configured to send a read command to the memory 104 to access data from a specified address of the memory 104. The read command may specify the physical address of a portion of the memory 104 (e.g., a physical address of a word line of the memory 104).

The host device 154 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The host device 154 may communicate via a host controller, which may enable the host device 154 to communicate with the data storage device 102. The host device 154 may operate in compliance with a JEDEC Solid State Technology Association industry specification, such as an embedded MultiMedia Card (eMMC) specification or a Universal Flash Storage (UFS) Host Controller Interface specification. The host device 154 may operate in compliance with one or more other specifications, such as a Secure Digital (SD) Host Controller specification as an illustrative example. Alternatively, the host device 154 may communicate with the data storage device 102 in accordance with another communication protocol.

In operation, the controller 140 may receive data 152 and a request for write access to the memory 104 from the host device 154 via the host interface 150. The data 152 may correspond to a data file (e.g., an image file, an audio file, or a video file, as illustrative examples). The controller 140 may input the data 152 to the ECC engine 142 to generate one or more ECC codewords based on the data 152.

The controller 140 may access the L2P mapping table 146 to determine one or more physical addresses of the memory 104 at which the one or more ECC codewords are to be stored. To illustrate, the controller 140 may access the L2P mapping table 146 to select one or more physical addresses of the memory 104 based on one or more logical addresses indicated by the request for write access received from the host device 154.

The controller 140 may access the parity group mapping table 144 to determine one or more parity groups associated with the one or more physical addresses. A parity group may include word lines of the memory 104 that are associated with a particular index location (e.g., 0, 1, or k). In a particular embodiment, a parity group includes a particular number of word lines from adjacent blocks of the memory 104, where the word lines have a common index location (e.g., 0, 1, or k). The index location may identify multiple word lines of each of the blocks 106, 108, 110, and 112 located between the particular index location and a surface of the memory die 103 (e.g., zero word lines for WL0, one word line for WL1, k word lines for WLk, etc.).

To further illustrate, in the example of FIG. 1, a parity group may include a set of word lines of the blocks 106, 108, 110, and 112 having a same index location (i.e., word lines that are commonly indexed). As an illustrative, non-limiting example, a parity group may include each word line WL0 of the blocks 106, 108, 110, and 112 (where the index location is 0).

In response to selecting a physical address from the L2P mapping table 146, the controller 140 may access the parity group mapping table 144 to determine a parity group associated with the physical address. For example, if a physical address corresponding to the word line WL0 of the block 108 is targeted for a write operation by the controller 140, the controller 140 may access the parity group mapping table 144 to determine that the word lines WL0 of the blocks 106, 108, 110, and 112 are associated with a parity group.

In this example, a parity operation may be performed based on data associated with (e.g., stored at or to be stored at) a subset of word lines of the parity group. To illustrate, the parity circuitry 124 may perform a parity operation based on data associated with each word line WL0 of the blocks 106, 108, and 110 to generate parity information. The parity operation may include a bitwise exclusive-OR (XOR) operation between data associated with each word line WL0 of the blocks 106, 108, and 110. The parity information may be stored at another word line of the parity group, such as at the word line WL0 of the block 112. In this example, the block 112 may be reserved for parity information generated using data from commonly indexed word lines of the parity group. For example, the word line WL0 of the block 112 may be reserved for the parity information generated based on the data associated with the word lines WL0 of the blocks 106, 108, and 110.

In a particular example, the selection circuitry 114 is configured to select data stored at the memory 104 for parity operations and to provide the data to the parity circuitry 124 via any of the parity latches 116, 118, 120, and 122. In another example, parity operations may be performed based on data prior to storing the data at the memory 104. For example, the controller 140 may provide data (e.g., one or more ECC codewords) to the data latches 128, and the parity circuitry 124 may retrieve the data from the data latches 128 for a parity operation (e.g., prior to writing the data to the memory 104 by the read/write circuitry 126).

Continuing with the above example, after data is written to the word lines WL0 of the blocks 106, 108, and 110 and after parity information is written to the word line WL0 of the block 112, the controller 140 may update the L2P mapping table 146 to indicate that physical addresses corresponding to each word line WL0 store information. For example, the controller 140 may update the L2P mapping table 146 to indicate that physical addresses corresponding to the word line WL0 of the blocks 106, 108, 110, and 112 are unavailable for a subsequent write operation.

The controller 140 may receive a request for read access to the memory die 103 from the host device 154 via the host interface 150. For example, the controller 140 may receive a request for read access to data stored at the word line WL0 of the block 106.

In response to the request for read access, the controller 140 may initiate a read operation, such as by sending a read command to the memory die 103 indicating a physical address associated with the word line WL0 of the block 106. The memory die 103 may output data from the word line WL0 of the block 106 (e.g., to the data latches 128) and may send the data to the controller 140 in response to the read command.

The controller 140 may initiate a decoding operation using the data. For example, the controller 140 may input the data to the ECC engine 142 to correct one or more errors that may be present in the data (e.g., due to noise, read errors, write errors, etc.). If the decoding operation is successful (e.g., if the decoding operation converges on a valid ECC codeword that can be mapped to user data, such as the data 152), then the controller 140 may send the user data to the host device 154 via the host interface 150.

In some circumstances, the ECC engine 142 may be unable to decode the data. For example, if an error rate of the data exceeds an error correction capability associated with the particular ECC scheme used to encode the data, then a decoding error may occur, such as an uncorrectable ECC (UECC) event.

In response to the error, the controller 140 may send an in-memory data recovery command 130 to the memory die 103. The in-memory data recovery command 130 may specify a word line indication 132, and the word line indication 132 may identify the physical address of the word line WL0 of the block 106.

The selection circuitry 114 is responsive to the in-memory data recovery command 130. The selection circuitry 114 may be configured to select word lines of a parity group associated with the word line corresponding to the word line indication 132. To illustrate, if the word line indication 132 identifies the word line WL0 of the block 106, the selection circuitry 114 may be configured to select other word lines of the parity group, such as the word lines WL0 of the blocks 108, 110, and 112.

Depending on the particular implementation, the selection circuitry 114 may be "hard-wired" to select the other word lines of the parity group in response to the word line indication 132. For example, the selection circuitry 114 may include logic gates and/or other selection logic that causes the selection circuitry 114 to select the other word lines of the parity group in response to the word line indication 132. In one or more other implementations, the selection circuitry 114 may store (or may be responsive to) a mapping table (not shown in FIG. 1) that can be updated during an operating life of the data storage device 102. As an illustrative example, as storage elements of the memory 104 undergo additional read operations and write operations, a number of blocks included in a parity group may be decreased (e.g., from four to three) in order to increase reliability of the parity scheme. In this case, the mapping table may be updated (e.g., via a firmware update at the data storage device 102) based on the change in the number of blocks included in the parity group. Similarly, the parity group mapping table 144 of the controller 140 may be updated, such as via a firmware update at the data storage device 102, or the parity group mapping table 144 may be "hard coded" into the controller 140, as illustrative examples.

In response to the word line indication 132, the selection circuitry 114 may select a subset of word lines of the memory 104 that correspond to the parity group that includes the word line WL0 of the block 106, such as by selecting each word line WL0 of the blocks 108, 110, and 112. The selection circuitry 114 may cause the read/write circuitry 126 to sense data stored at the blocks 108, 110, and 112 and to output the data to the parity latches 118, 120, and 122.

The parity circuitry 124 may be responsive to the data stored at the parity latches 118, 120, and 122. For example, the parity circuitry 124 may be configured to access the data at the parity latches 118, 120, and 122 and to perform a parity operation, such as a bitwise XOR operation, to generate recovered data corresponding to the data stored at the word line WL0 of the block 106. The parity circuitry 124 may output the recovered data to the data latches 128, and the memory die 103 may provide the recovered data from the data latches 128 to the controller 140.

The controller 140 may input the recovered data to the ECC engine 142. The ECC engine 142 may decode the recovered data to generate data, which may correspond to the data 152. The controller 140 may send the data to the host device 154 via the host interface 150.

Because the recovered data is available at the data latches 128, the memory die 103 may be configured to rewrite the recovered data at the memory 104 from the data latches 128 (e.g., without receiving a write command from the controller 140). In a NAND flash implementation, the data stored at the word line WL0 of the block 106 may be invalidated after the UECC event, such as by updating the L2P mapping table 146 to indicate that the word line WL0 of the block 106 stores invalid data. The memory die 103 may rewrite the recovered data at a location of the memory 104, such as at another word line of the block 106 or at a word line of another block of the memory 104. In this example, the controller 140 may update the parity group mapping table 144 to indicate that the location of the rewritten data is to be associated with the parity group, such as with the word lines WL0 of the blocks 108, 110, and 112. In another embodiment, the block 106 can be erased, and data can be rewritten to the block 106, such as by writing the recovered data to the word line WL0 of the block 106. In this example, the parity group mapping table 144 may not be updated by the controller 140.

In a ReRAM implementation, the memory die 103 may be configured to rewrite the recovered data "in-place" at the memory 104. For example, data at the word line WL0 of the block 106 may be overwritten with the recovered data. In this example, the L2P mapping table 146 and the parity group mapping table 144 may not be updated by the controller 140.

After recovering data, parity information may be regenerated at the data storage device 102 based on the recovered data. To illustrate, if data written at the memory 104 is corrupted with write errors prior to generating parity information based on the data, then the parity information may include "wrong" values. Thus, after recovering data at the data storage device 102, the parity circuitry 124 may regenerate parity information (such as using the example techniques described above).

In FIG. 1, the selection circuitry 114 may select multiple word lines of the memory 104 based on a single memory address indication (e.g., the word line indication 132). For example, because parity groups may include word lines that share a same index value (e.g., 0, 1, or k), the selection circuitry 114 may select multiple word lines in parallel (and without receiving multiple address indications from the controller 140). As a result, performance at the data storage device 102 may be enhanced by enabling parallel selection of word lines for parity operations and by reducing a number of address indications transmitted on a bus that may connect the controller 140 and the memory die 103.

The example of FIG. 1 further illustrates that parity operations can be performed "in-memory" at the memory die 103. Because data need not be transferred from the memory die to the controller 140 to perform the parity operations, traffic on a bus that connects the controller 140 and the memory die 103 may be further reduced. Accordingly, performance of the data storage device 102 may be enhanced.

Figure 2:
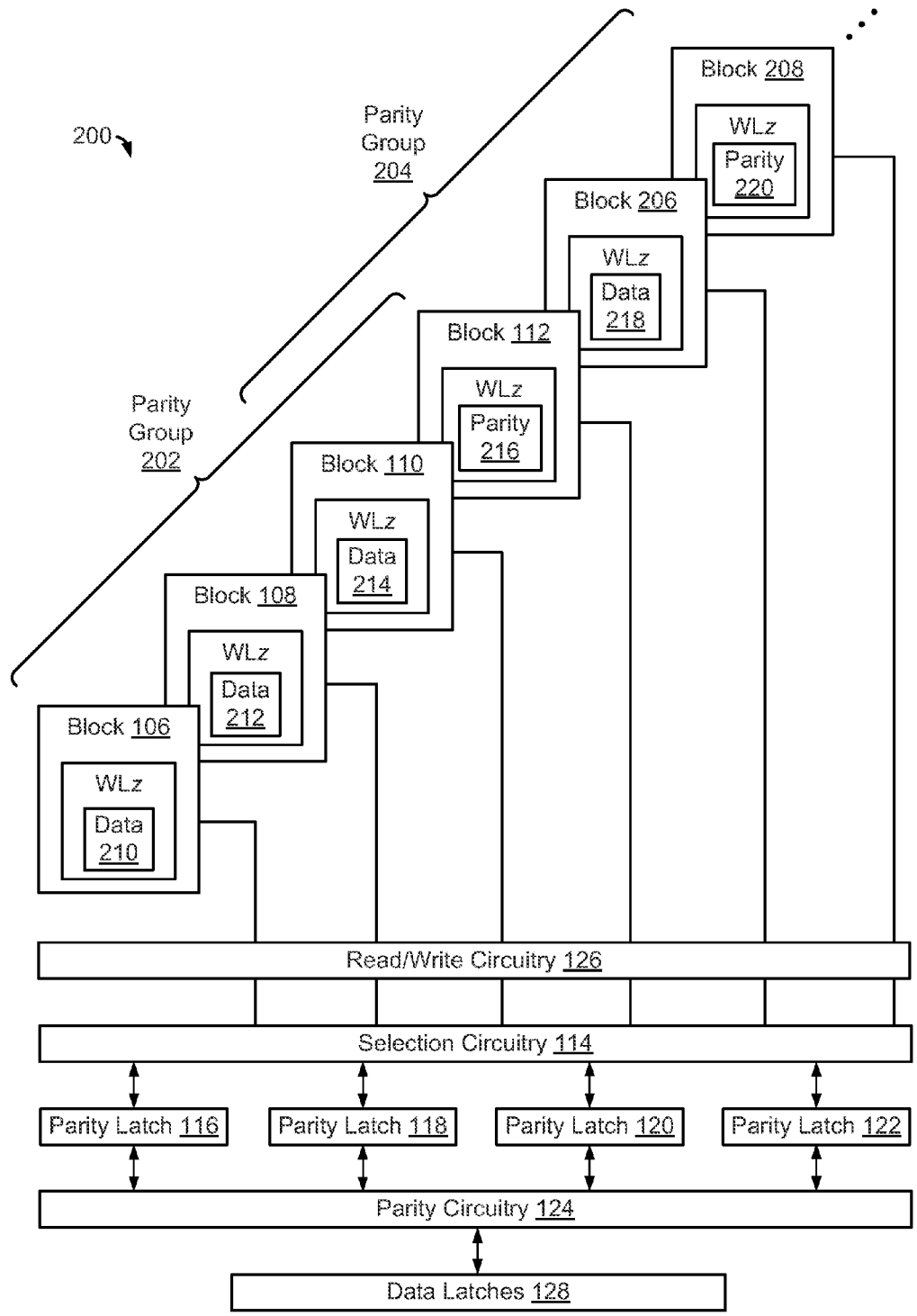
FIG. 2 is a block diagram of an illustrative embodiment of a portion of the memory die of FIG. 1.

Referring to FIG. 2, an illustrative example of a device is depicted and generally designated 200. The device 200 may be integrated within the memory die 103 of FIG. 1.

Certain components and operations of the device 200 may be as described with reference to the memory die 103 of FIG. 1. For example, the device 200 may include the blocks 106, 108, 110, and 112. As another example, the device 200 may include the selection circuitry 114 and the parity latches 116, 118, 120, and 122. The device 200 may further include the parity circuitry 124, the read/write circuitry 126, and the data latches 128. The device 200 may be responsive to the controller 140 of FIG. 1. It should be appreciated that the device 200 may further include one or more connections or buses omitted from FIG. 2 for clarity.

FIG. 2 also illustrates that the device 200 may further include a block 206 and a block 208. In FIG. 2, the blocks 106, 108, 110, and 112 may be included in a parity group 202. The blocks 110, 112, 206, and 208 may be included in a parity group 204. Thus, the example of FIG. 2 illustrates "overlapping" parity groups, since for example the parity groups 202, 204 both include the blocks 110, 112. It should be appreciated that the parity group mapping table 144 of FIG. 1 may indicate that the blocks 106, 108, 110, and 112 correspond to the parity group 202 and that the blocks 110, 112, 206, and 208 correspond to the parity group 204.

In operation, the device 200 may initiate a parity operation, such as a parity operation to generate parity information. To initiate the parity operation, the selection circuitry 114 may select a set of word lines. The set of word lines may include commonly indexed word lines of blocks of one of the parity groups 202, 204. To illustrate, the selection circuitry 114 may select a word line WLz of each of the blocks 106, 108, and 110, where z is a positive integer number selected from 0, 1, . . . k.

The selection circuitry 114 may cause the read/write circuitry 126 to read data stored at the blocks 106, 108, and 110, such as data 210, 212, and 214. The selection circuitry 114 may provide the data 210, 212, and 214 to the parity latches 116, 118, and 120 (or may cause the read/write circuitry 126 to output the data 210, 212, and 214 to the parity latches 116, 118, and 120). The parity latches 116, 118, and 120 may provide the data 210, 212, and 214 to the parity circuitry 124.

The parity circuitry 124 may perform a parity operation based on the data 210, 212, and 214. For example, the parity circuitry 124 may perform a bitwise XOR operation to generate parity information. The parity circuitry 124 may latch the parity information into the parity latch 122. The parity information may be written to the block 112 by the read/write circuitry 126 (e.g., as parity information 216). Thus, the parity information 216 is associated with the parity group 202.

Similarly, the device 200 may generate parity information 220 associated with the parity group 204. The parity information 220 may be generated based on the data 214, based on the parity information 216, and further based on data 218. For example, the parity circuitry 124 may perform a bitwise XOR operation based on the data 214, the parity information 216, and the data 218 to generate the parity information 220.

The device 200 may initiate a parity operation to recover data, such as in response to a UECC event at the controller 140 of FIG. 1. To illustrate, if a UECC event occurs during decoding of the data 214, the data 214 can be recovered using a bitwise XOR between the data 210, the data 212, and the parity information 216. Alternatively, because the block 110 is included in both parity groups 202, 204, the data 214 may be recovered using a bitwise XOR between the parity information 216, the data 218, and the parity information 220. Thus, the example of FIG. 2 illustrates "overlapping" parity groups.

Because the block 110 is included in multiple parity groups (the parity groups 202, 204), the data 214 can be recovered in case of multiple UECC events associated with the parity group 202 or in case of multiple UECC events associated with the parity group 204. Thus, data reliability may be enhanced at a data storage device using the example of FIG. 2.

Referring to FIG. 3, an illustrative example of a method is depicted and generally designated 300. The method 300 may be performed at a data storage device (e.g., the data storage device 102) that includes a memory die (e.g., the memory die 103). The memory die may include parity circuitry (e.g., the parity circuitry 124) and a memory (e.g., the memory 104) having a three-dimensional (3D) memory configuration. The memory may include a first block, a second block, and a third block. The first block, the second block, and the third block may correspond to blocks described with reference to FIGS.

1 and 2. In a particular illustrative example, the first block corresponds to the block 108, the second block corresponds to the block 110, and the third block corresponds to the block 112. Alternatively, the first block, the second block, and the third block may correspond to other blocks.

The method 300 includes generating parity information based on first data associated with a first word line of the first block and further based on second data associated with a second word line of the second block, at 302. In an illustrative example, the first data corresponds to the data 212 and the second data corresponds to the data 214. The parity information is generated by parity circuitry, such as the parity circuitry 124. The parity information may correspond to the parity information 216.

The method 300 further includes writing the parity information to a third word line of the third block, at 304. In an illustrative example, the selection circuitry 114 causes the read/write circuitry 126 to write the parity information 216 at the block 112.

The method 300 may optionally include accessing the parity information and the second data in response to a decoding error associated with the first data. To illustrate, the decoding error may correspond to a UECC event associated with the data 212 during decoding of the data 212 by the ECC engine 142. In response to the UECC event, the controller 140 may send the in-memory data recovery command 130 to the memory die 103. In response to the in-memory data recovery command 130, the selection circuitry 114 may cause the read/write circuitry 126 to read the data 214 and the parity information 216. The selection circuitry 114 may select multiple word lines in parallel based on a single memory address indication (e.g., based on the word line indication 132).

The method 300 may optionally include generating recovered data corresponding to the first data. For example, the recovered data may be generated by performing a bitwise XOR operation based on the parity information 216 and the data 214 by the parity circuitry 124. Depending on a number of blocks included in a parity group, the bitwise XOR operation may additionally use other information (e.g., the data 210).

In a particular embodiment, the first block and the second block are included in a first parity group of blocks of the memory, and the third block is reserved for parity information generated using data from commonly indexed word lines of the parity group of blocks. To illustrate, the blocks 108, 110 may be included in the parity group 202, and the block 112 may be reserved for parity information generated using data from word lines of the parity group 202 having a common index value (e.g., z, where z is selected from 0, 1, . . . k). In a particular embodiment, the second block is further included in a second parity group of blocks of the memory, and the first block is not included in the second parity group. To illustrate, in the example of FIG. 2, the block 110 is included in the parity group 204, and the block 108 is not included in the parity group 204.

The method 300 of FIG. 3 illustrates that a memory may include parity circuitry to perform in-memory parity operations, which may reduce a number of communications sent between a memory and a controller of a data storage device. Further, by grouping commonly indexed word lines within a parity group, a parity operation can be initiated using a single memory address indication (e.g., by selecting word lines in parallel based on the word line indication 132).

Figure 4:
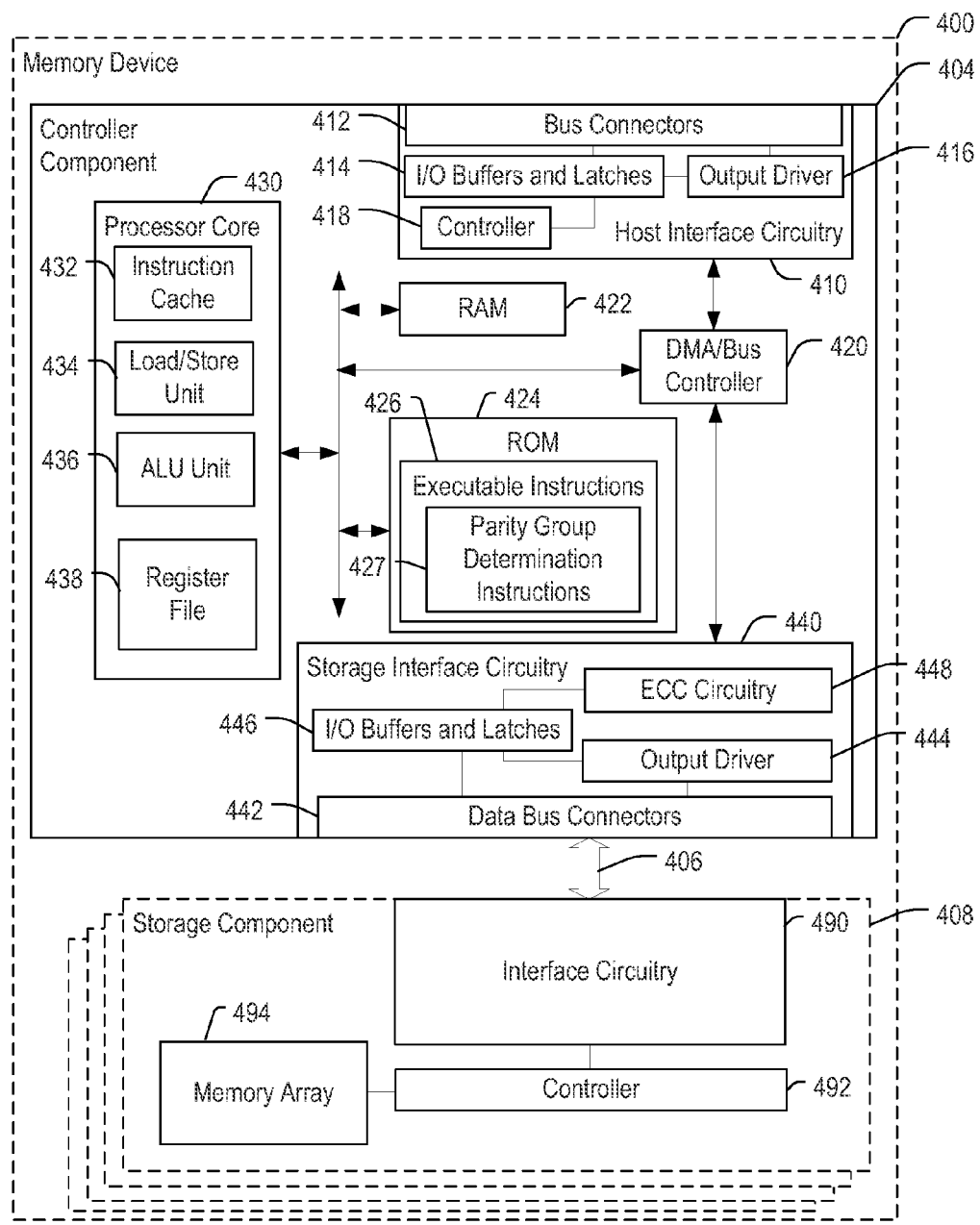
FIG. 4 is a block diagram of a particular embodiment of a memory device that may be included in the data storage device of FIG. 1.

Referring to FIG. 4, an illustrative example of a memory device is depicted and generally designated 400. The memory device 400 includes a controller component 404 coupled to one or more storage components, such as a representative storage component 408, via a bus 406. The representative storage component 408 includes interface circuitry 490 to communicate via the bus 406. The storage component 408 also includes a controller 492 that is coupled to the interface circuitry 490 and that is also coupled to a memory, such as a memory array 494. The memory array 494 may include one or more types of storage media, such as a NAND flash array or a ReRAM array. The memory array 494 may have a 3D memory configuration. Alternatively, the memory array 494 may have another configuration, such as a 2D memory configuration. In a particular embodiment, the memory device 400 may correspond to the data storage device 102 of FIG. 1.

In a particular embodiment, the controller component 404 includes host interface circuitry 410 coupled to a direct memory access (DMA)/bus controller 420. The controller component 404 also includes storage interface circuitry 440 that is coupled to the DMA/bus controller 420. A processor core 430, a random access memory (RAM) 422 and a read-only memory (ROM) 424 are coupled to the DMA/bus controller 420 via an internal bus.

In a particular embodiment, the host interface circuitry 410 includes bus connectors 412 coupled to input/output (I/O) buffers and latches 414. The bus connectors 412 are further coupled to output driver circuitry 416. The host interface circuitry 410 also includes a controller 418. In a particular embodiment, the host interface circuitry 410 operates in accordance with a universal serial bus (USB) protocol. For example, the controller 418 may be programmed to receive USB protocol instructions and data from a host device (not shown) via the bus connectors 412 that are coupled to a universal serial bus. The controller 418 may include a hardware processor that executes instructions stored at an internal memory, such as a read-only memory (not shown) to enable receipt and acknowledgment of USB instructions and data. Alternatively, or in addition, the host interface circuitry 410 may be configured to support other communication protocols, such as a Secure Digital (SD) protocol, a small computer system interface (SCSI), a parallel interface, a serial interface, such as a serial peripheral interface (SPI), a Compact Flash (CF) protocol, one or more other protocols, or any combination thereof.

In a particular embodiment, the processor core 430 includes an instruction cache 432, a load/store unit 434, an arithmetic logic unit (ALU) unit 436, and a register file 438. The processor core 430 may include, or may function substantially similarly to, an ARM core, as an illustrative, non-limiting example. For example, the processor core 430 may support a reduced instruction set computer (RISC) microarchitecture. The processor core 430 may be configured to retrieve data and executable instructions 426 via the load/store unit 434 from the ROM 424. The executable instructions 426 may be executable by the processor core 430 to perform one or more operations described herein.

For example, the executable instructions 426 may include parity group determination instructions 427 executable by the processor core 430 to determine parity groups of blocks of the memory array 494. The parity groups may include the parity groups 202, 204 of FIG. 2. To further illustrate, the parity group determination instructions 427 may be executable by the processor core 430 to identify common index values associated with memory addresses, such as word line indices (e.g., 0, 1, . . . k) and to group such memory addresses into parity groups.

Alternatively, or in addition, at least some of the executable instructions 426 may not be stored at the ROM 424 and may be stored at the memory array 494. The executable instructions 426 may be retrieved from the memory array 494 and stored at the RAM 422. The processor core 430 may be configured to retrieve the executable instructions 426 from the RAM 422 for execution.

The executable instructions 426 may be retrieved by the load/store unit 434 and stored to the instruction cache 432. The ALU unit 436 may include dedicated circuitry to perform arithmetic and logic operations, such as addition and subtraction, AND, NOT, OR, exclusive-OR (XOR), other arithmetic or logic operations, or any combination thereof. It should be appreciated that the storage component 408 may include logic gates and/or an ALU unit (not shown) configured to perform arithmetic logic operations. For example, the parity circuitry 124 may be implemented within logic gates and/or an ALU unit of the controller 492 of the storage component 408.

The register file 438 may include multiple memory cells that may provide high speed access to the processor core 430 of data to be used for execution of instructions. One or more memory cells at the register file 438 may be dedicated to store a status indicator. Additional data values, such as values to indicate memory type, memory write status, and write protect status, may also be set during execution of the executable instructions 426 at the processor core 430.

The storage interface circuitry 440 may include data bus connectors 442, an output driver 444, input/output buffers and latches 446, and ECC circuitry 448. The data bus connectors 442 may include electrical connectors to enable electrical signal propagation via the bus 406. The I/O buffers and latches 446 may be configured to store data that is received via the DMA/bus controller 420 to be transmitted via the bus 406 using electrical signals at the data bus connectors 442 that are generated by the output driver 444. In addition, or alternatively, the I/O buffers and latches 446 may store data values represented by electrical signals received at the data bus connectors 442 via the bus 406, such as signals generated by the interface circuitry 490 of the storage component 408.

The ECC circuitry 448 may correspond to the ECC engine 142 of FIG. 1. The ECC circuitry 448 may include dedicated hardware and circuitry configured to perform operations using data and error correcting code information corresponding to the data that are received as a result of a memory read from the storage component 408, and may perform logical or arithmetic operations to verify that the received data is not detected to have corrupted values. For example, the received data may include additional bits representing an error correcting code, which may be encoded based on values of the data upon storage at the memory array 494. Corruption of one or more bits of the data, or one or more bits of the error correcting code, may be detectable by the ECC circuitry 448. For example, the storage interface circuitry 440 may include a flash memory interface, and the ECC circuitry 448 may be compliant with one or more flash error correcting code protocols.

Figure 5:
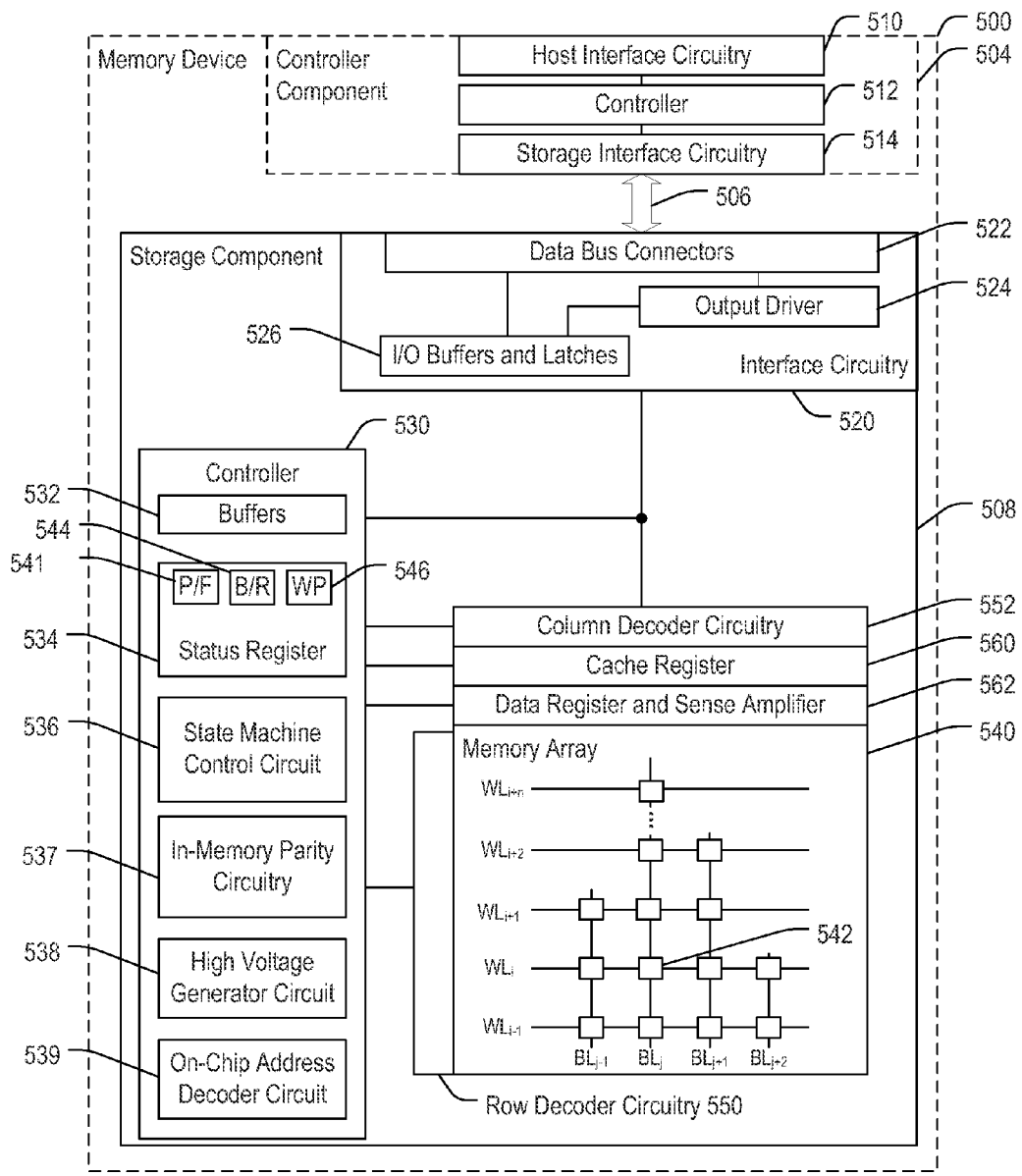
FIG. 5 is a block diagram of another particular embodiment of a memory device that may be included in the data storage device of FIG. 1.

Referring to FIG. 5, an illustrative embodiment of a memory device is depicted and generally designated 500. The memory device 500 includes a controller component 504 coupled to a storage component 508. In a particular embodiment, the memory device 500 may correspond to the data storage device 102 of FIG. 1. For example, the controller component 504 may correspond to the controller 140 of FIG. 1, and the storage component 508 may correspond to the memory 104 of FIG. 1. The storage component 508 may have a 3D memory configuration. Alternatively, the storage component 508 may have another configuration, such as a 2D memory configuration.

The controller component 504 may include host interface circuitry 510, a controller 512, and storage interface circuitry 514. The controller component 504 may be coupled to the storage component 508 via a data bus 506, such as an 8-bit or 16-bit parallel data bus, as an illustrative, non-limiting example. The controller component 504 may communicate instructions and data with an external host (not shown) via the host interface circuitry 510. The controller 512 may be configured to respond to instructions received by the host interface circuitry 510 and may also be configured to send and receive data and instructions to the storage component 508 via the storage interface circuitry 514.

In a particular embodiment, the storage component 508 includes interface circuitry 520, a controller 530 coupled to the interface circuitry 520, and a memory array 540 accessible to the controller 530. The storage component 508 may include one or more sets of row decoder circuitry, such as row decoder circuitry 550. The storage component may further include column decoder circuitry 552. The row decoder circuitry 550 and the column decoder circuitry 552 may enable access to data stored at one or more particular rows and particular columns of the memory array 540, such as to read a value from or to write a value to a particular memory cell 542 at a bit line $BL_j$ and at word line $WL_i$. A cache register 560 and a data register and sense amplifier 562 may further be coupled to the memory array 540 and may be used to cache or to temporarily store data that is to be written to the memory array 540 or data that has been read out of the memory array 540. In a particular embodiment, the memory array 540 may include a flash memory or a ReRAM. The memory array 540 may have a 3D memory configuration.

In a particular embodiment, the controller 530 includes one or more buffers 532 to store instructions, data, or any combination thereof. The controller 530 may also include one or more status registers 534, a state machine control circuit 536, in-memory parity circuitry 537, a high voltage generator circuit 538, and an on-chip address decoder circuit 539. The in-memory parity circuitry 537 may correspond to the parity circuitry 124 of FIGS. 1 and 2.

The controller 530 may be coupled to provide electrical signals to the row decoder circuitry 550, to the column decoder circuitry 552, to the cache register 560, and to the data register and sense amplifier 562. In a particular embodiment, the controller 530, including one or more of the buffers 532, the status register 534, the state machine control circuit 536, the high-voltage generation circuit 538, and the on-chip address decoder circuit 539, in conjunction with the interface circuitry 520 and the memory array 540, may be configured to perform one or more operations described with reference to the method 300 of FIG. 3. Alternatively or in addition, the controller 512 may be configured to perform one or more operations of the method 300 of FIG. 3.

In a particular embodiment, the status register 534 of the controller 530 may include one or more indicators storing values, such as a pass/fail (P/F) value 541, a busy/ready (B/R) value 544, a write protect (WP) value 546, one or more other indicators, or a combination thereof. The status register 534 may be accessible to the state machine control circuit 536.

The state machine control circuit 536 may include dedicated hardware and circuitry to control an operation of the controller 530 in response to one or more received instructions and internal states, such as may be represented at the status register 534. The state machine control circuit 536 may include states such as a read status state, a data write state, a data read state, as illustrative, non-limiting examples.

In a particular embodiment, the high voltage generator circuit 538 may be responsive to the state machine control circuit 536 and may be configured to generate a high voltage to program values to, or erase values from, the memory array

540. For example, the memory array 540 may be a flash memory or other memory that may be programmable or erasable via a "high" voltage, such as, for example, five volts (V). Alternatively, the memory array 540 may include a ReRAM. The memory array 540 may have a 3D memory configuration, such as a vertical 3D memory configuration (e.g., a vertical 3D NAND flash memory configuration). The controller 530 may also include the on-chip address decoder circuit 539 that may include hardware and logic circuitry to receive memory address information from the controller component 504 and to decode the memory address information to specific rows and columns to be provided to the row decoder circuitry 550 and the column decoder circuitry 552.

The interface circuitry 520 may include data bus connectors 522, an output driver 524 coupled to the data bus connectors 522, and input/output (I/O) buffers and latches 526. The I/O buffers and latches 526 may be configured to store or to latch data that is received via the data bus connectors 522 or data that is to be written to the data bus 506 via the data bus connectors 522. The data bus connector 522 may include physical electrical connectors that couple the interface circuitry 520 to the data bus 506. The output driver 524 may include dedicated circuitry and electrical connections to enable the interface circuitry 520 to drive electrical signals over the data bus 506. In a particular embodiment, the interface circuitry 520 is configured to comply with one or more bus communications protocols or standards.

Figure 6:
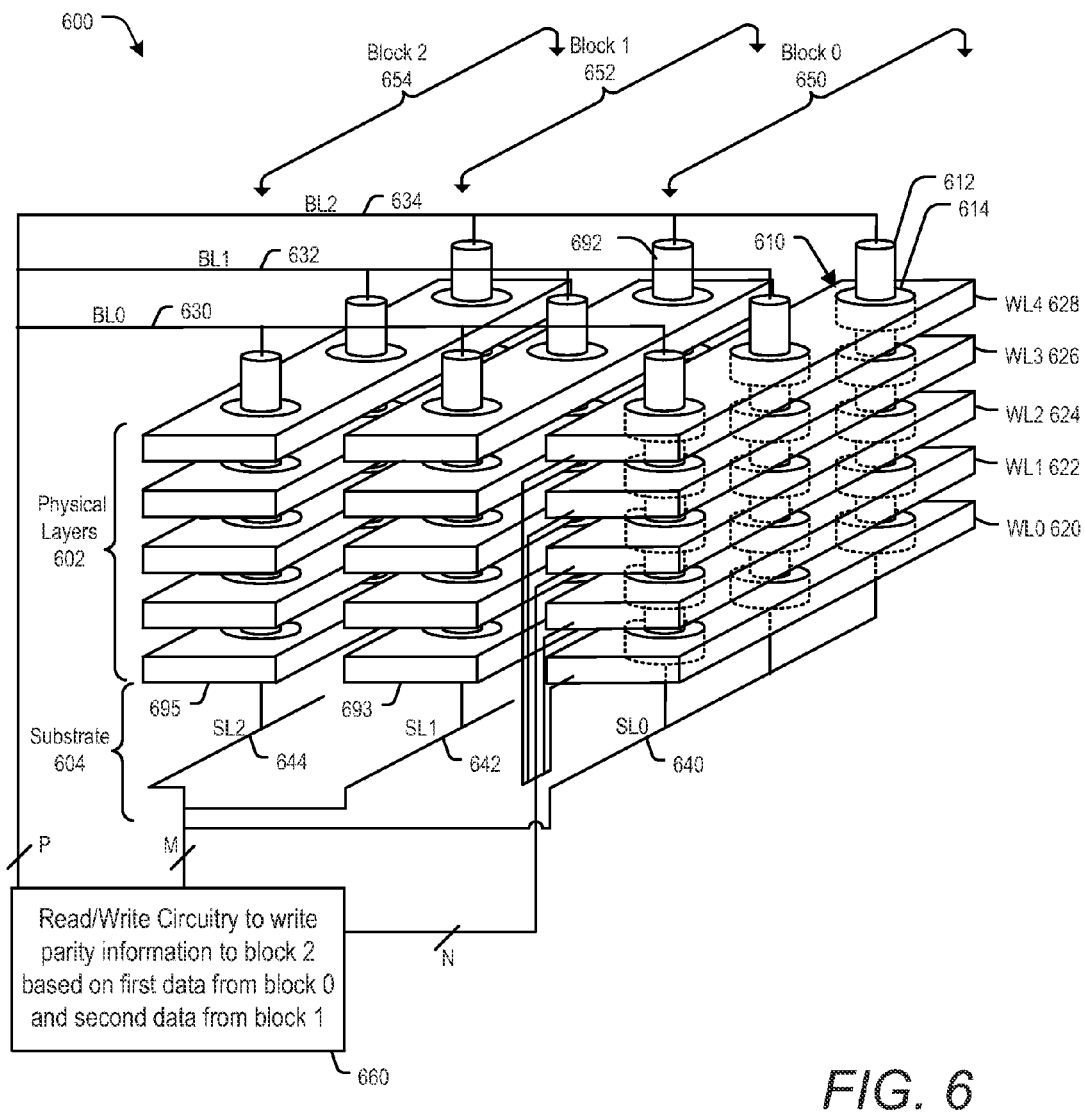
FIG. 6 is a block diagram of a particular embodiment of a memory die that may be included in the data storage device of FIG. 1.

FIG. 6 illustrates an embodiment of a memory die 600 in a NAND flash configuration. The memory die 600 may be included in the data storage device 102 of FIG. 1. For example, the memory die 600 may correspond to the memory die 103 of FIG. 1. The memory die 600 may be coupled to the controller 140 of FIG. 1.

The memory die 600 includes multiple physical layers, such as a group of physical layers 602. The multiple physical layers are monolithically formed above a substrate 604, such as a silicon substrate. Storage elements (e.g., memory cells), such as a representative memory cell 610, are arranged in arrays in the physical layers.

The representative memory cell 610 includes a charge trap structure 614 between a word line/control gate (WL4) 628 and a conductive channel 612. Charge may be injected into or drained from the charge trap structure 614 via biasing of the conductive channel 612 relative to the word line 628. For example, the charge trap structure 614 may include silicon nitride and may be separated from the word line 628 and the conductive channel 612 by a gate dielectric, such as silicon oxide. An amount of charge in the charge trap structure 614 affects an amount of current through the conductive channel 612 during a read operation of the memory cell 610 and indicates one or more bit values that are stored in the memory cell 610.

The memory die 600 includes multiple erase blocks, including a first block (block 0) 650, a second block (block 1) 652, and a third block (block 2) 654. Each block 650-654 includes a "vertical slice" of the physical layers 602 that includes a stack of word lines, illustrated as a first word line (WL0) 620, a second word line (WL1) 622, a third word line (WL2) 624, a fourth word line (WL3) 626, and a fifth word line (WL4) 628. Multiple conductive channels (having a substantially vertical orientation with respect to FIG. 6) extend through the stack of word lines. Each conductive channel is coupled to a storage element in each word line 620-628, forming a NAND string of storage elements. FIG. 6 illustrates three blocks 650-654, five word lines 620-628 in each block, and three conductive channels in each block for clarity of illustration. However, the memory die 600 may have more than three blocks, more than five word lines per block, and more than three conductive channels per block.

Read/write circuitry 660 is coupled to the conductive channels via multiple conductive lines, illustrated as a first bit line (BL0) 630, a second bit line (BL1) 632, and a third bit line (BL2) 634 at a "top" end of the conducive channels (e.g., farther from the substrate 604) and a first source line (SL0) 640, a second source line (SL1) 642, and a third source line (SL2) 644 at a "bottom" end of the conductive channels (e.g., nearer to or within the substrate 604). The read/write circuitry 660 is illustrated as coupled to the bit lines 630-634 via "P" control lines, coupled to the source lines 640-644 via "M" control lines, and coupled to the word lines 620-628 via "N" control lines. Each of P, M, and N may have a positive integer value based on the specific configuration of the memory die 600. In the illustrative example of FIG. 6, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 692 and a particular source line may be coupled to the top of the conductive channel 612. The bottom of the conductive channel 692 may be coupled (e.g., electrically coupled) to the bottom of the conductive channel 612. Accordingly, the conductive channel 692 and the conductive channel 612 may be coupled in series and may be coupled to the particular bit line and the particular source line.

The read/write circuitry 660 may operate as described with respect to the read/write circuitry 126 of FIG. 1. For example, data may be stored to storage elements coupled to the word line 628 and the read/write circuitry 660 may read bit values from the storage elements. As another example, the read/write circuitry 660 may apply selection signals to control lines coupled to the word lines 620-628, the bit lines 630-634, and the source lines 640-642 to cause a programming voltage (e.g., a voltage pulse or series of voltage pulses) to be applied across selected storage element(s) of the selected word line (e.g., the fourth word line 628).

The read/write circuitry 660 may be configured to write parity information to the third block 654 based on first data associated with the first block 650 and further based on second data associated with the second block 652. To illustrate, the first data may be selected from the first word line 620, and the second data may be selected from a word line 693 of the second block 652. The first data and the second data may be selected by the selection circuitry 114 of FIGS. 1 and 2. A parity operation may be performed based on the first data and the second data to generate the parity information. The parity operation may include a bitwise XOR operation. The parity operation may be performed by the parity circuitry 124 of FIGS. 1 and 2. The read/write circuitry 660 may be configured to write the parity information to the third block 654, such as at a word line 695 of the third block 654. In this example, a parity group includes the blocks 650-654, and a set of commonly indexed word lines (the word lines 620, 693, and 695, which have a same particular index location of 0 in the example of FIG. 6) are included in the parity group. In FIG. 6, the particular index location identifies multiple word lines (e.g., a number of the word lines) of each block of the memory die 103 that are located between the particular index location and a surface of the substrate 604 (e.g., zero word lines for the word line 620, one word line for the word line 622, etc.).

During a read operation, the controller 140 may receive a request from a host device, such as the host device 154 of FIG. 1. The controller 140 may cause the read/write circuitry 660 to read bits from particular storage elements of the memory die 600 by applying appropriate signals to the control lines to cause storage elements of a selected word line to be sensed. Accordingly, the memory die 600 may be configured to read from and write data to one or more storage elements.

Figure 7:
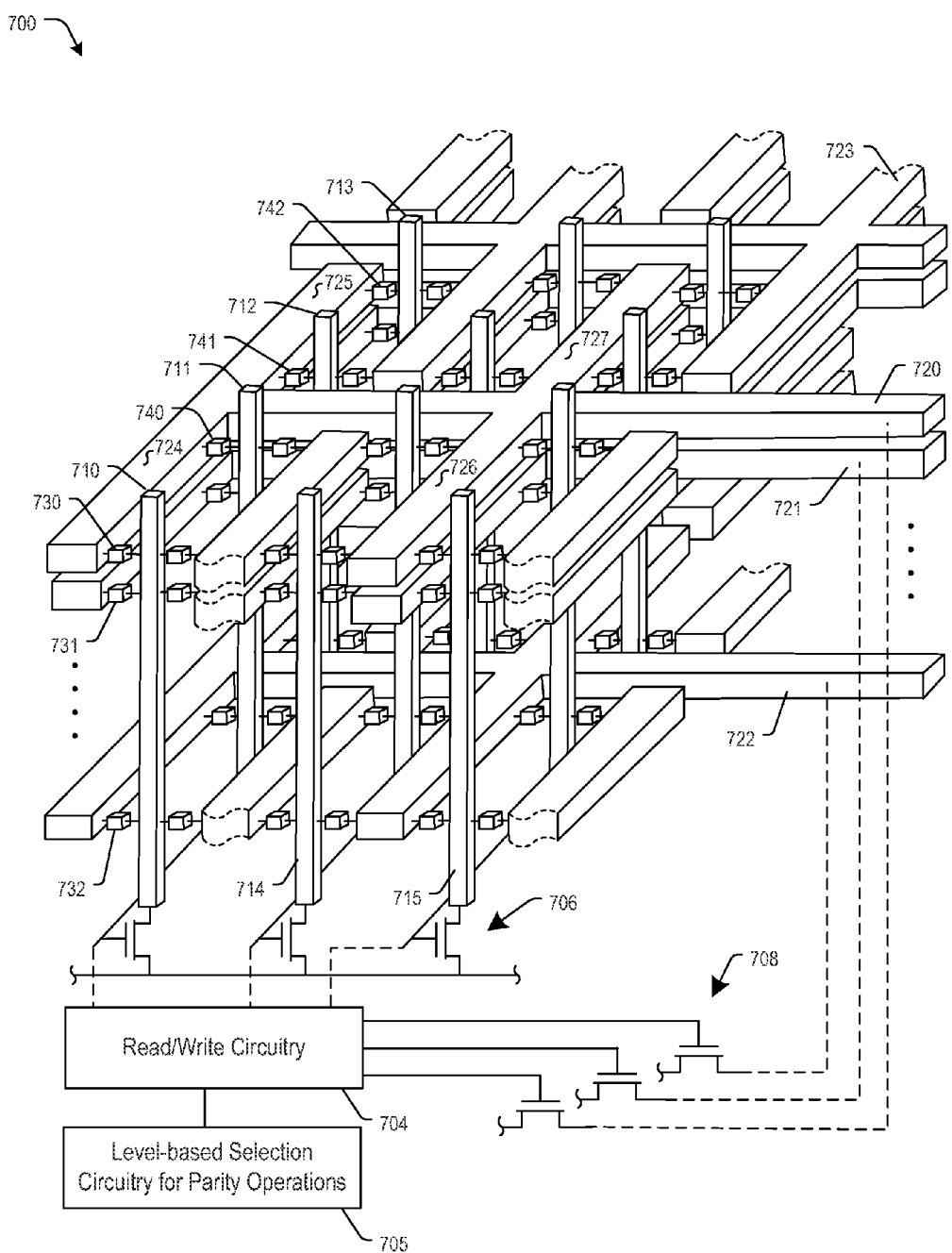
FIG. 7 is a block diagram of another particular embodiment of a memory die that may be included in the data storage device of FIG. 1.

FIG. 7 is a diagram of a particular embodiment of a memory die 700 in a ReRAM configuration. The memory die 700 may be included in the data storage device 102 of FIG. 1. For example, the memory die 700 may correspond to the memory die 103 of FIG. 1. The memory die 700 may be coupled to the controller 140 of FIG. 1.

In the embodiment illustrated in FIG. 7, the memory die 700 includes a vertical bit line ReRAM with a plurality of conductive lines in physical layers over a substrate (e.g., substantially parallel to a surface of the substrate), such as representative word lines 720, 721, 722, and 723 (only a portion of which is shown in FIG. 7) and a plurality of vertical conductive lines through the physical layers, such as representative bit lines 710, 711, 712, and 713. The word line 722 may include or correspond to a first group of physical layers, and the word lines 720, 721 may include or correspond to a second group of physical layers.

The memory die 700 also includes a plurality of resistance-based storage elements (e.g., memory cells), such as representative storage elements 730, 731, 732, 740, 741, and 742, each of which is coupled to a bit line and a word line in arrays of memory cells in multiple physical layers over the substrate (e.g., a silicon substrate). The memory die 700 also includes read/write circuitry 704, such as the read/write circuitry 126 of FIG. 1. The read/write circuitry 704 is coupled to word line drivers 708 and bit line drivers 706.

In the embodiment illustrated in FIG. 7, each of the word lines includes a plurality of fingers (e.g., a first word line 720 includes fingers 724, 725, 726, and 727). Each finger may be coupled to more than one bit line. To illustrate, a first finger 724 of the first word line 720 is coupled to a first bit line 710 via a first storage element 730 at a first end of the first finger 724 and is coupled to a second bit line 711 via a second storage element 740 at a second end of the first finger 724.

In the embodiment illustrated in FIG. 7, each bit line may be coupled to more than one word line. To illustrate, the first bit line 710 is coupled to the first word line 720 via the first storage element 730 and is coupled to a third word line 722 via a third storage element 732.

During a write operation, the controller 140 of FIG. 1 may receive data from a host device, such as the host device 154 of FIG. 1. The controller 140 may send the data (or a representation of the data) to the memory die 700. For example, the controller 140 may encode the data prior to sending the encoded data to the memory die 700.

The read/write circuitry 704 may write the data to storage elements corresponding to the destination of the data. For example, the read/write circuitry 704 may apply selection signals to selection control lines coupled to the word line drivers 708 and the bit line drivers 706 to cause a write voltage to be applied across a selected storage element. For example, to select the first storage element 730, the read/write circuitry 704 may activate the word line drivers 708 and the bit line drivers 706 to drive a programming current (also referred to as a write current) through the first storage element 730. To illustrate, a first write current may be used to write a first logical value (e.g., a value corresponding to a high-resistance state) to the first storage element 730, and a second write current may be used to write a second logical value (e.g., a value corresponding to a low-resistance state) to the first storage element 730. The programming current may be applied by generating a programming voltage across the first storage element 730 by applying a first voltage to the first bit line 710 and to word lines other than the first word line 720 and applying a second voltage to the first word line 720. In a particular embodiment, the first voltage is applied to other bit lines (e.g., the bit lines 714, 715) to reduce leakage current in the memory die 700.

In the example of FIG. 7, the read/write circuitry 704 is responsive to level-based selection circuitry 705. For example, the level-based selection circuitry 705 may select commonly-indexed sets of storage elements of the memory die 700 for parity operations. As an example, storage elements adjacent to (or nearest) a substrate of the memory die 700 may have an index of zero. To illustrate, storage elements of the word line 722 may have an index of zero. The level-based selection circuitry 705 may select storage elements having an index of zero for a parity operation that generates parity information, and the read/write circuitry 704 may write the parity information to another storage region of the memory die 700 having an index of zero. In a particular embodiment, the level-based selection circuitry 705 corresponds to the selection circuitry 114 of FIG. 1.

During a read operation, the controller 140 may receive a request from a host device, such as the host device 154 of FIG. 1. The controller 140 may cause the read/write circuitry 704 to read bits from particular storage elements of the memory die 700 by applying selection signals to selection control lines coupled to the word line drivers 708 and the bit line drivers 706 to cause a read voltage to be applied across a selected storage element. For example, to select the first storage element 730, the read/write circuitry 704 may activate the word line drivers 708 and the bit line drivers 706 to apply a first voltage (e.g., 0.7 volts (V)) to the first bit line 710 and to word lines other than the first word line 720. A lower voltage (e.g., 0 V) may be applied to the first word line 720. Thus, a read voltage is applied across the first storage element 730, and a read current corresponding to the read voltage may be detected at a sense amplifier of the read/write circuitry 704. The read current corresponds (via Ohm's law) to a resistance state of the first storage element 730, which corresponds to a logical value stored at the first storage element 730. The logical value read from the first storage element 730 and other elements read during the read operation may be provided to the controller 140.

Although the controller 140 and certain other components described herein are illustrated as block components and described in general terms, such components may include one or more microprocessors, state machines, and/or other circuits configured to enable the data storage device 102 (or one or more components thereof) to perform operations described herein. One or more components described herein may be operationally coupled using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein. As an illustrative example, the selection circuitry 114 may include one or more multiplexors (MUXes). As another example, the parity circuitry 124 may include logic gates, such as complementary metal-oxide-semiconductor (CMOS) logic gates. The logic gates may be configured to perform logical operations, such as XOR operations.

Alternatively or in addition, one or more aspects of the data storage device 102 may be implemented using a microprocessor or microcontroller programmed (e.g., by executing instructions) to perform operations described herein, such as one or more operations of the method 300 of FIG. 3. In a particular embodiment, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM).

To further illustrate, the controller 140 may include a processor that is configured to execute instructions to perform certain operations described herein. The instructions may include general purpose instructions, and the processor may include a general purpose execution unit operable to execute general purpose instructions. As an illustrative example, the processor may execute the instructions to generate parity information, such as by executing one or more load instructions to load data into the processor and by executing one or more instructions that cause the processor to perform a bit-wise XOR operation based on the data. As another example, the processor may execute the instructions to write the parity information to a memory location, such as by executing a store instruction having an argument indicating the memory location.

It should be appreciated that one or more operations described herein as being performed by the controller 140 may be performed at the memory 104. As an illustrative example, "in-memory" ECC operations may be performed at the memory die 103 alternatively or in addition to performing such operations at the controller 140.

The data storage device 102 may be attached to or embedded within one or more host devices, such as within a housing of a host communication device (e.g., the host device 154). For example, the data storage device 102 may be integrated within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory. However, in other embodiments, the data storage device 102 may be implemented in a portable device configured to be selectively coupled to one or more external devices, such as the host device 154.

To further illustrate, the data storage device 102 may be configured to be coupled to the host device 154 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or a combination thereof. Alternatively or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
   a controller; and
   a memory die coupled to the controller, wherein the memory die includes parity circuitry, read/write circuitry, and a memory, wherein the memory includes a first block, a second block, and a third block, wherein the parity circuitry is configured to generate parity information based on first data associated with a first word line of the first block and further based on second data associated with a second word line of the second block, wherein the read/write circuitry is configured to write the parity information to a third word line of the third block, wherein the first block, the second block, and the third block are included in a first parity group of blocks of the memory, and wherein the parity circuitry is further configured to generate second parity information associated with a second parity group of blocks that includes the second block.

2. The data storage device of claim 1, wherein the parity circuitry is further configured to generate the parity information using a bitwise exclusive-OR (XOR) operation.

3. The data storage device of claim 1, wherein the first word line is associated with a particular index location within the first block, wherein the second word line is associated with the particular index location within the second block, and wherein the third word line is associated with the particular index location within the third block.

4. The data storage device of claim 3, wherein the particular index location identifies multiple word lines of each block that are located between the particular index location and a surface of a substrate of the memory die.

5. The data storage device of claim 1, wherein the memory die further includes parity latches coupled to the parity circuitry.

6. The data storage device of claim 1, wherein the memory has a three-dimensional (3D) memory configuration that is monolithically formed in one or more physical levels of arrays of memory cells having an active area above a silicon substrate, and wherein the memory die further includes circuitry associated with operation of the memory cells.

7. The data storage device of claim 1, wherein the second parity group of blocks further includes a fourth block of the memory and a fifth block of the memory.

8. The data storage device of claim 1, wherein including the second block in the first parity group and in the second parity group enables recovery of the second data upon multiple uncorrectable error correcting code (UECC) events associated with the first parity group.

9. The data storage device of claim 1, further comprising selection circuitry configured to select the second word line of the second block and the third word line of the third block in parallel and to access a mapping table indicating blocks of the memory included in the first parity group and further indicating blocks of the memory included in the second parity group.

10. The data storage device of claim 9, wherein the controller is further configured to update the mapping table to change a number of blocks associated with each parity group indicated by the mapping table.

11. The data storage device of claim 9, wherein the controller is configured to provide an indication of the first word line to the selection circuitry, and wherein the selection circuitry is further configured to select the second word line and the third word line based on the indication of the first word line.

12. The data storage device of claim 11, wherein the controller is further configured to provide the indication of the first word line to the selection circuitry in response to a decoding error associated with the first data.

13. The data storage device of claim 11, wherein the indication indicates a physical address of the first word line, and wherein the selection circuitry is further configured to select the second word line and the third word line for a sense operation by the read/write circuitry based on the physical address of the first word line.

14. A device comprising:
a controller; and
a memory die coupled to the controller, wherein the memory die includes redundancy information circuitry, read/write circuitry, and a memory, wherein the memory includes a first erase group of storage elements, a second erase group of storage elements, a third erase group of storage elements, a fourth erase group of storage elements, and a fifth erase group of storage elements, wherein the redundancy information circuitry is configured to generate first redundancy information based on data associated with the first erase group of storage elements and data associated with the second erase group of storage elements, and wherein the redundancy information circuitry is further configured to generate second redundancy information based on data associated with the fourth erase group of storage elements and data associated with the fifth erase group of storage elements.

15. The device of claim 14, wherein the third erase group of storage elements is configured to store the first redundancy information, and wherein the redundancy information circuitry is further configured to generate the second redundancy information based further on the first redundancy information.

16. The device of claim 14, wherein the memory has a three-dimensional (3D) memory configuration that is monolithically formed in one or more physical levels of arrays of memory cells having an active area above a silicon substrate, and wherein the memory die further includes circuitry associated with operation of the memory cells.

17. A method comprising:
at a data storage device that includes a memory die, wherein the memory die includes parity circuitry and a memory, and wherein the memory includes a first block, a second block, a third block, a fourth block, and a fifth block, performing:
generating, at the parity circuitry, first parity information based on first data associated with a first word line of the first block and further based on second data associated with a second word line of the second block;
writing the first parity information to a third word line of the third block; and
generating second parity information based on third data associated with a fourth word line of the fourth block, fourth data associated with a fifth word line of the fifth block, and the first parity information.

18. The method of claim 17, further comprising selecting, by selection circuitry of the memory die, the second word line of the second block and the third word line of the third block in parallel.

19. The method of claim 18, further comprising receiving an indication of an index value associated with the first word line from a controller of the data storage device, wherein the second word line and the third word line are selected in response to the indication to enable the controller to recover the first data.

20. The method of claim 17, wherein the memory has a three-dimensional (3D) memory configuration that is monolithically formed in one or more physical levels of arrays of memory cells having an active area above a silicon substrate, and wherein the memory die further includes circuitry associated with operation of the memory cells.

* * * * *